United States Patent
Park et al.

(10) Patent No.: US 7,306,425 B2
(45) Date of Patent: Dec. 11, 2007

(54) FAN ASSEMBLY

(75) Inventors: Chul-min Park, Seoul (KR);
Kyoung-choul Jang, Suwon-si (KR);
Sung-je Woo, Suwon-si (KR)

(73) Assignee: Samsung Electronics Co., Ltd.,
Suwon-Si (KR)

(*) Notice: Subject to any disclaimer, the term of this patent is extended or adjusted under 35 U.S.C. 154(b) by 162 days.

(21) Appl. No.: 10/953,192

(22) Filed: Sep. 30, 2004

(65) Prior Publication Data
US 2005/0106008 A1     May 19, 2005

(30) Foreign Application Priority Data
Oct. 6, 2003    (KR)    ............... 10-2003-0069333

(51) Int. Cl.
*F04D 29/66*     (2006.01)
*F04D 29/52*     (2006.01)

(52) U.S. Cl. ............... 415/119; 415/214.1; 415/220
(58) Field of Classification Search ............... 415/119, 415/213.1, 214.1, 220, 223
See application file for complete search history.

(56) References Cited

U.S. PATENT DOCUMENTS

| | | | |
|---|---|---|---|
| 4,807,718 A | 2/1989 | Lotz | |
| 5,186,605 A * | 2/1993 | Tracy | 601/2 |
| 5,208,730 A | 5/1993 | Tracy | |
| 6,556,437 B1 * | 4/2003 | Hardin | 361/687 |
| 6,779,975 B2 * | 8/2004 | Takashima et al. | 415/213.1 |
| 2003/0053908 A1 | 3/2003 | Takashima et al. | |

FOREIGN PATENT DOCUMENTS

| | | |
|---|---|---|
| JP | 11-340665 | 12/1999 |
| JP | 2000-232276 | 8/2000 |
| KR | 2003-69611 | 8/2003 |
| KR | 2003-71073 | 9/2003 |

OTHER PUBLICATIONS

Chinese Office Action issued on Sep. 29, 2006 with respect to Chinese Patent Application No. 2004100803270.

* cited by examiner

*Primary Examiner*—Edward K. Look
*Assistant Examiner*—Nathan Wiehe
(74) *Attorney, Agent, or Firm*—Staas & Halsey LLP

(57) ABSTRACT

A fan assembly including a fan, a supporting case to cover an outer surface of the fan and to support the fan, and an anti vibration member interposed between the fan and the supporting case to prevent a vibration occurring in the fan from being transmitted to the supporting case.

13 Claims, 5 Drawing Sheets

FAN ASSEMBLY

CROSS-REFERENCE TO RELATED APPLICATIONS

This application claims the benefit of Korean Patent Application No. 2003-69333, filed on Oct. 6, 2003, in the Korean Intellectual Property Office, the disclosure of which is incorporated herein by reference.

BACKGROUND OF THE INVENTION

1. Field of the Invention

The present invention relates to a fan assembly, and more particularly, to a fan assembly to prevent a vibration which occurs due to a rotation of a fan being transmitted to a whole system

2. Description of the Related Art

Recently, a multi-media technique has been rapidly developed with an advent of an information-oriented society, which makes a displaying device more important. A plane displaying device, such as a liquid crystal display (LCD), a plasma display panel (PDP), a projector, etc., have been actively studied and developed.

The displaying device includes a printed circuit board (PCB). The PCB includes a large number of highly integrated electronic components. Thus, when the displaying device is operated, the electronic components generate more heat than that of the conventional displaying device. Thus, a heat generating problem arises during an operation of the whole system using the conventional natural cooling method.

To solve the above problem, a compulsory cooling method using a fan is applied. For example, the projector uses 1-2 fans and the PDP uses 3-6 fans.

As shown in FIG. 1, a conventional fan assembly comprises a supporting case 2, a fan 4 provided in the supporting fan 2, and a connector 6 connecting the fan 4 and the supporting case 2. The supporting case 2 is fixed to a part of the whole system.

However, due to the above fan assembly, lives of the electronic components that are sensitive to a vibration may be shortened and a malfunction and a noise may occur, because vibrations which occur as a result of a rotation of the fan 4 may be transmitted to the whole system through the supporting case 2.

Recently, fan assemblies having anti vibration members have been developed to reduce the vibration and the noise. These fan assemblies reduce some of vibrations in the fan. However, these fan assemblies require relatively complicated manufacturing processes. Moreover, the anti vibration member is provided in a part of the system such as a combining part in which the fan and the supporting case are combined, so that completely cutting off the vibration in the fan is difficult and the anti vibration efficiency becomes low.

SUMMARY OF THE INVENTION

Accordingly, it is an aspect of the present invention to provide a fan assembly having a simple structure and an improved anti vibration efficiency.

The foregoing and/or other aspects of the present invention are also achieved by providing a fan assembly comprising: a fan; a supporting case provided outside of the fan to support the fan; and an anti vibration member interposed between the fan and the supporting case to prevent a vibration occurring in the fan from being transmitted to the supporting case.

According to another aspect of the invention, the supporting case comprises a first case and a second case that are detachably connected to each other.

According to another aspect of the invention, one of the first and second cases includes a connecting protrusion and the other of the first and second cases includes a connecting hole corresponding to the connecting protrusion.

According to another aspect of the invention, the anti vibration member is provided at each side of outer parts of the fan with a substantially symmetrical shape and comprises a first member and a second member each having an accommodating part to accommodate the outer parts of the fan.

Additional and/or other aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
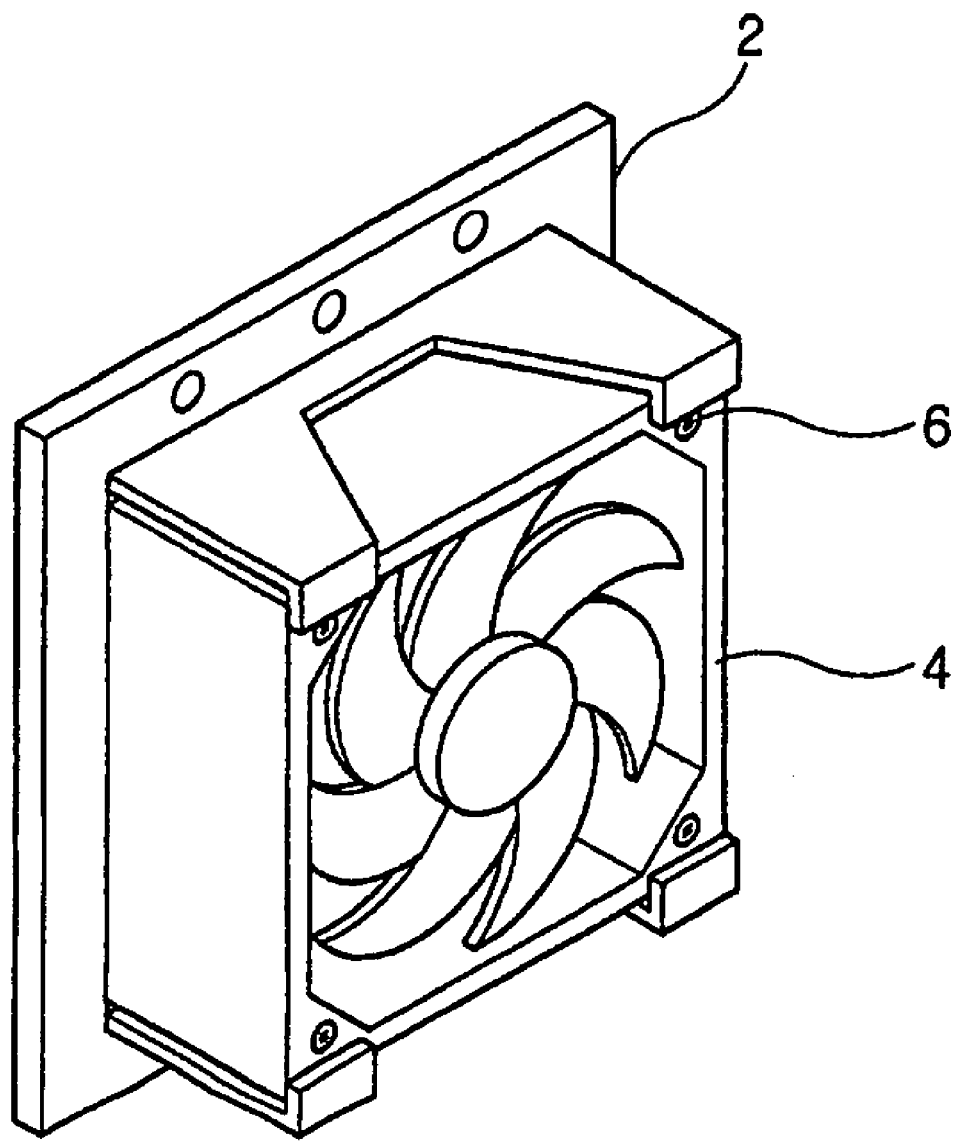
FIG. 1 is a perspective view of a conventional assembly.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2:
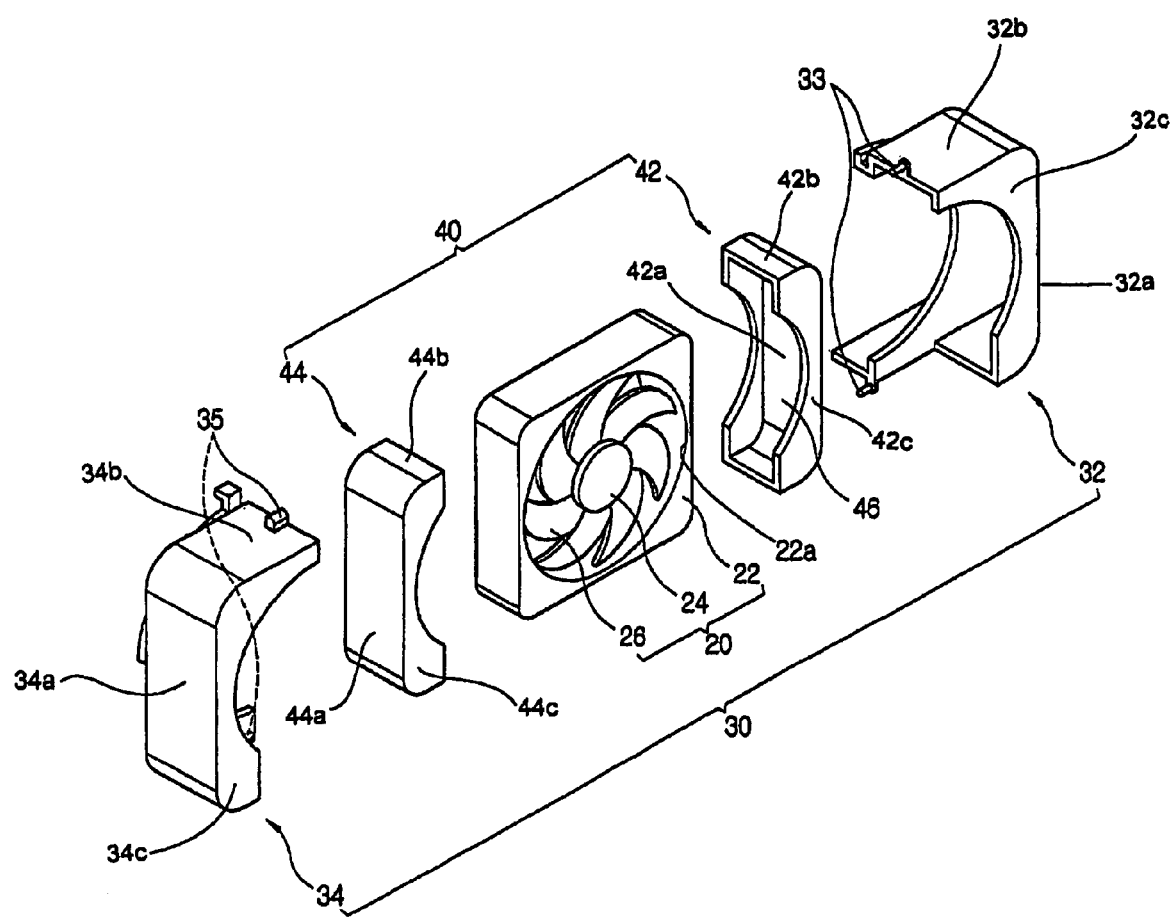
FIG. 2 is an exploded perspective view of a fan assembly according to an embodiment of the present invention.
Figure 3:
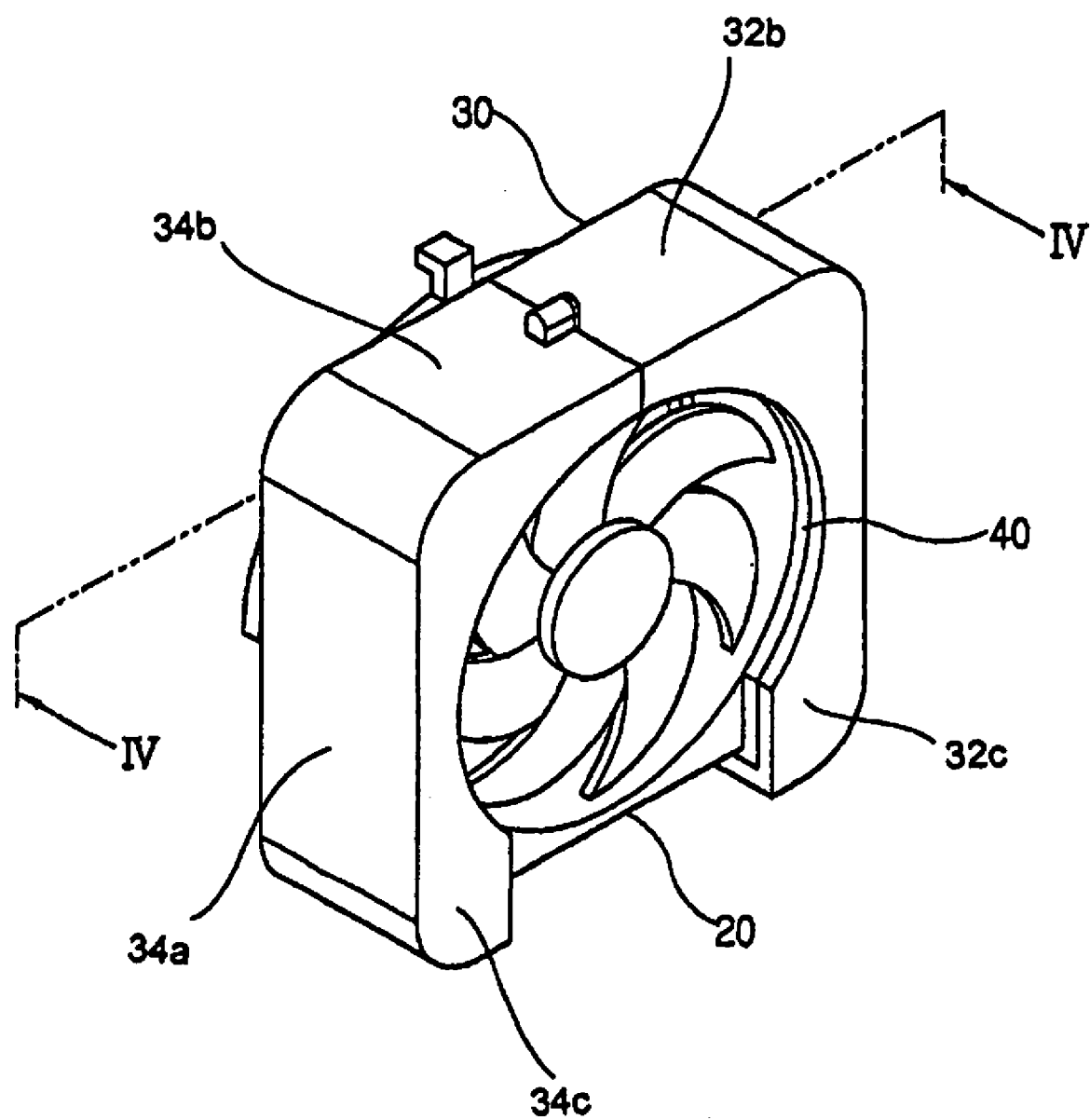
FIG. 3 is a combined perspective view of FIG. 2.
Figure 4:
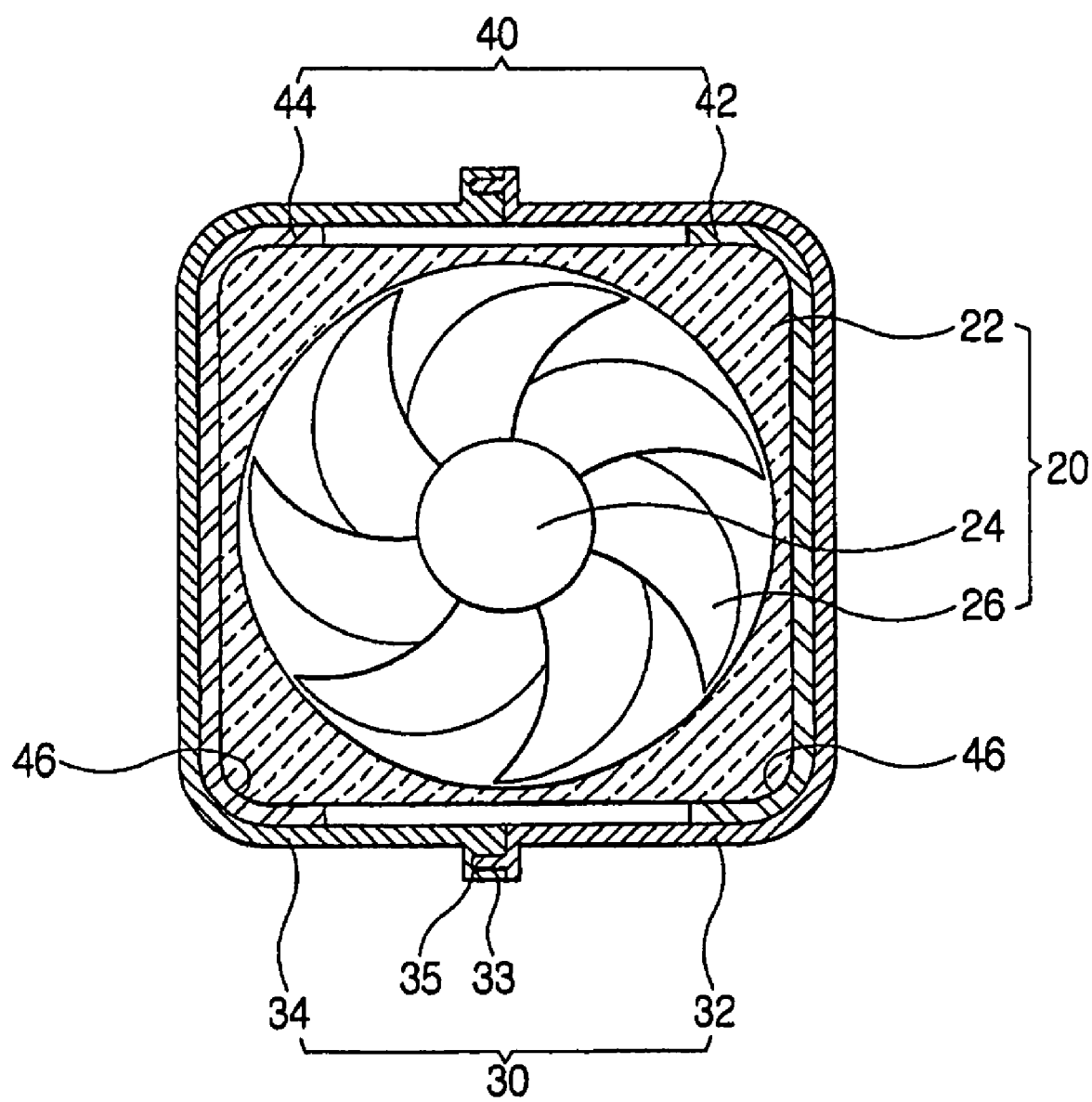
FIG. 4 is a sectional view according to a section IV-IV of FIG. 3.

As shown in FIGS. 2 through 4, a fan assembly according to an embodiment of the present invention comprises a fan 20, a supporting case 30 to cover an outer surface of the fan 20 and to firmly support the fan 20, and an anti vibration member 40 interposed between the fan 20 and the supporting case 30 to prevent a vibration occurring in the fan 20 from being transmitted to the supporting case 30.

The fan 20 is a device to create an air flow by rotating a set of rotation wings and is divided into a cooling fan and a ventilation fan according to a purpose of use.

The fan 20 comprises a fan housing 22, a rotation shaft 24 provided in a hole of the fan housing 22 to be rotated by a driver (not shown), and rotation wings 26 connected to a circumference of the rotation shaft 24 to be rotated with the rotation shaft 24. The rotation shaft 24 is employed to transmit the turning force of the driver to the rotation wings 26.

The anti vibration member 40 is provided at each side of the outer surface of the fan housing 22 with a substantially symmetrical shape and comprises first and second members 42 and 44 each having an accommodating part 46 to accommodate the outer surface of the fan 20.

Each of the first and second members 42 and 44 has a substantially similar structure in order to allow the accommodating part 46 to accommodate the outer surface of the fan 20. This structure is such that the first and second members 42 and 44 are provided at each side of the outer surface of the fan 20 with a substantially symmetrical shape in a horizontal direction. The structure of the first and second members 42 and 44 may be varied as long as indirect contact between the fan 20 and the supporting case 30 is maintained.

Furthermore, in an embodiment of the invention, the first and second members respectively comprise base 42a and 44a, end parts 42b and 44b, and wings 42c and 44c. The corresponding bases 42a and 44a, the end parts 42b and 44b, and the wings 42c and 44c combine with each other to form tight fitting pockets around opposite sides of the fan housing 22.

The anti vibration member 40 may be made of various materials that provide anti vibration properties, but, in an embodiment of the invention, the anti vibration member 40 is made of rubber. Rubber provides particularly strong anti vibration properties and when the shaft of the fan 20 rotates with a low speed, this advantage is important. That is, the anti vibration member 40 must be made of material having a low resonance point and rubber is a material that has a low resonance point.

In contrast from the conventional fan assembly in which a connector such as a bolt is required, the fan 20 and the anti vibration member 40 are supported in the supporting case 30 by the supporting force of the supporting case 30, which results in a simpler and firmer structure than that of the conventional fan assembly.

The supporting case 30 comprises a first case 32 to cover a part of the outer surface of the fan 20; and a second case 34 detachably connected to the first case 32 to cover the other part of the outer surface of the fan 20. The first and second cases 32 and 34 closely contact the outer surface of the fan 20 and, in an embodiment of the invention, the anti vibration member 40 to support the outer surface of the fan 20 and the anti vibration member 40 with a pressing force of the supporting case 30 and/or the anti vibration member 40, to firmly fix the fan 20.

In an embodiment of the invention, the first and second cases 32 and 34 of the supplying case 30 respectively include a base 32a and 34a, end parts 32b and 34b, and wings 32c and 33c which combine with each other to form tight fitting pockets to fit around the anti vibration member 40.

However, it is understood that a structure of the supporting case 30 may be varied as long as the supporting case 30 firmly supports the anti vibration member 40 and the fan 20.

One of the first and second cases 32 and 34 is formed with two or more connecting protrusions 33. The other of the first and second cases 32 and 34 is formed with two or more connecting holes 35 to correspond in position to the connecting protrusion 33. Of course, it is understood that one of the first and second cases may include both a protrusion and a connecting hole whereas the other of the first and second cases includes a corresponding connecting hole and protrusion.

The above noted arrangements enable the first and second cases 32 and 34 to be connected with and detached from each other with ease. Thus, the supporting case 30 may be assembled and the anti vibration member 40 may be repaired with ease as compared to conventional assemblies.

Figure 5:
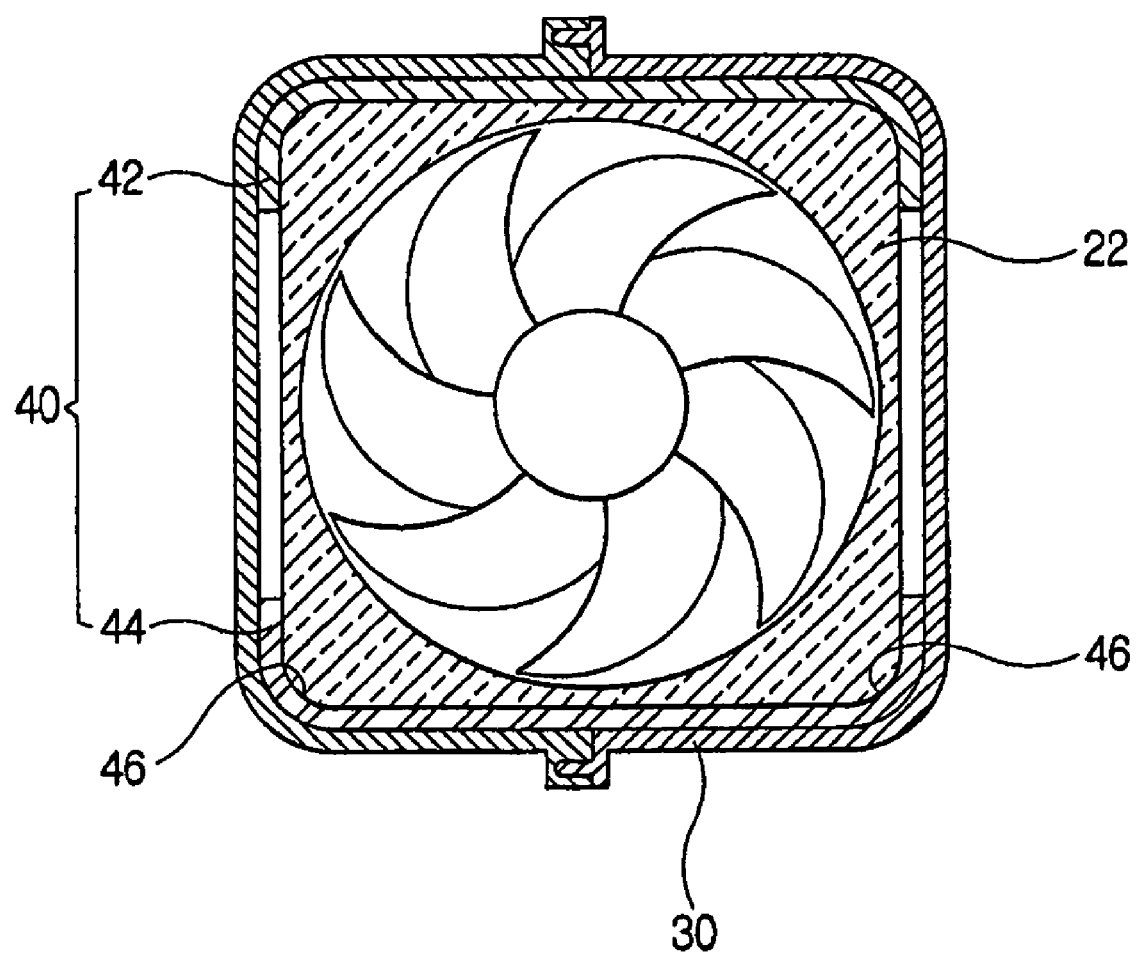
FIG. 5 is a sectional view of another embodiment in which an anti vibration member is disposed differently from the above embodiment.

FIG. 5 is a sectional view of another embodiment in which an anti vibration member is disposed differently from the above embodiment.

As shown herein, the anti vibration member 40, interposed between the fan 20 and the supporting case 30, is provided at the outer surface of the fan 20 with a substantially symmetrical shape in a longitudinal direction. The anti vibration member 40, according to this embodiment, also comprises first and second members 42 and 44 each having an accommodating part 46.

As is described above, according to the present invention, the supporting case supports the fan and the anti vibration member with a supporting force of the supporting case, thereby providing a simpler structure of the fan assembly than that of the conventional fan assembly.

Further, the anti vibration member covers the outer surface of the fan to efficiently prevent a vibration occurring in the fan from being transmitted to the supporting case, thereby reducing the vibration and the noise of the whole system.

Although a few embodiments of the present invention have been shown and described, it will be appreciated by those skilled in the art that changes may be made in these embodiments without departing from the principles and spirit of the invention, the scope of which is defined in the claims and their equivalents

What is claimed is:

1. A fan assembly comprising:
   a fan;
   a supporting case to cover an outer surface of the fan and to support the fan; and
   an anti vibration member interposed between the fan and the supporting case, to prevent a vibration which occurs in the fan from being transmitted to the supporting case;
   wherein the supporting case comprises a first case and a second case that are detachably connected to each other and cover respective sides of the outer surface,
   wherein an inner rear surface of the supporting case contacts an outer surface of the anti vibration member,
   wherein the direction which the anti vibration member is detachably connected with respect to the fan is the same direction which the first case and second case are detachably connected with respect to the fan.

2. The fan assembly according to claim 1, wherein the anti vibration member is provided at each side of the outer surface of the fan with a substantially symmetrical shape and comprises a first member and a second member each having an accommodating part to accommodate the outer surface of the fan.

3. The fan assembly according to claim 2, wherein the anti vibration member is made of rubber.

4. A fan assembly comprising:
   a fan;
   a supporting case comprising first and second cases to cover an outer surface of the fan and to support the fan; and
   an anti vibration member interposed between the fan and the supporting case, to prevent a vibration which occurs in the fan from being transmitted to the supporting case,
   wherein one of the first and second cases includes a connecting protrusion and the other of the first and second cases includes a connecting hole corresponding to the connecting protrusion and an inner surface of the supporting case contacts an outer surface of the anti vibration member, wherein the direction which the anti vibration member is detachably connected with respect to the fan is the same direction which the first case and second case are detachably connected with respect to the fan.

5. The fan assembly according to claim 4, wherein the anti vibration member is provided at each side of the outer surface of the fan with a substantially symmetrical shape and comprises a first member and a second member each having an accommodating part to accommodate the outer surface of the fan.

6. The fan assembly according to claim 5, wherein the anti vibration member is made of rubber.

7. A fan assembly, comprising:
a fan, including a housing having an outer surface, to create an airflow;
a supporting case, including an inner surface, to cover and support the outer surface of the fan; and
an anti vibration member between the fan and the supporting case to tightly fit around the outer surface of the fan and to tightly fit inside the inner surface of the supporting case;
wherein the supporting case comprises first and second cases on opposite sides of the outer surface of the fan to support the anti vibration member and the fan and an inner surface of the supporting case contacts an outer surface of the anti vibration member,
wherein the direction which the anti vibration member is detachably connected with respect to the fan is the same direction which the first case and second case are detachably connected with respect to the fan.

8. The fan assembly according to claim 7, wherein the opposite sides are provided on latitudinal sides of the fan.

9. The fan assembly according to claim 7, wherein the opposite sides are provided on longitudinal sides of the fan.

10. The fan assembly according to claim 7, wherein the first and second members are made of rubber.

11. The fan assembly according to claim 7, wherein the first and second cases of the supporting case respectively comprise 2 or more pairs of male and female connectors to connect the first and second cases together.

12. A fan assembly, comprising:
a fan, including a housing having an outer surface, to create an airflow;
a supporting case, including first and second cases each having an inner surface, which cooperate with each other to cover and support opposite sides of the outer surface of the fan; and
an anti vibration member between the fan and the supporting case to tightly fit around the outer surface of the fan and to tightly fit inside the inner surface of the supporting case,
wherein an inner surface of the supporting case contacts an outer surface of the anti vibration member,
wherein the direction which the anti vibration member is detachably connected with respect to the fan is the same direction which the first case and second case are detachably connected with respect to the fan.

13. A fan assembly, comprising:
a fan, including a housing having an outer surface, to create an airflow;
a supporting case, including first and second cases each having an inner surface, which connect with each other to cover and support opposite sides of the outer surface of the fan; and
an anti vibration member between the fan and the supporting case to tightly fit around the outer surface of the fan and to tightly fit inside the inner surface of the supporting case,
wherein an inner surface of the supporting case contacts an outer surface of the anti vibration member,
wherein the direction which the anti vibration member is detachably connected with respect to the fan is the same direction which the first case and second case are detachably connected with respect to the fan.

* * * * *